United States Patent [19]

Vilimek

[11] 4,264,981
[45] Apr. 28, 1981

[54] CIRCUIT ARRANGEMENT FOR COMPENSATING THE CHANGE IN INPUT CAPACITANCE AT A FIRST GATE ELECTRODE OF A DUAL-GATE MOS FIELD-EFFECT TRANSISTOR

[75] Inventor: Vaclav Vilimek, Freising, Fed. Rep. of Germany

[73] Assignee: Texas Instruments Deutschland GmbH, Freising, Fed. Rep. of Germany

[21] Appl. No.: 893,570

[22] Filed: Apr. 4, 1978

[30] Foreign Application Priority Data

Apr. 19, 1977 [DE] Fed. Rep. of Germany ....... 2717339

[51] Int. Cl.² .......................... H04B 1/16; H03F 3/16
[52] U.S. Cl. .................................. 455/333; 307/304; 330/277; 330/290
[58] Field of Search ............... 325/451, 484, 485, 442, 325/318; 332/16 T, 18, 49, 31 T; 330/277, 290, 292, 296, 76, 96, 129; 307/304; 455/330, 333, 341, 293, 294

[56] References Cited

U.S. PATENT DOCUMENTS

| | | | |
|---|---|---|---|
| 3,480,873 | 11/1969 | Carter | 330/277 |
| 3,525,050 | 8/1970 | Wolf et al. | 330/277 |
| 3,720,879 | 3/1973 | Reitmeyer, Jr. | 330/277 |
| 4,003,060 | 1/1977 | Broce et al. | 325/451 |

OTHER PUBLICATIONS

VHF-Tuner mit Feldeffekttransistoren—K. Schurig—1974, Funk-Technik, No. 21, pp. 743, 744.
"Outlook Bright for Dual Gate Transistors"-IEEE Trans. on Broadcast and T.V. Receivers-Jul. 1967, p. 80.
"NF Voltmeter With Metaloxide Field Effect Transistors", Funk-Technik 1966, No. 8, p. 274.
"Electronics" Magazine Article on p. 141 of Jul. 10, 1967 issue.

Primary Examiner—Marc E. Bookbinder
Attorney, Agent, or Firm—Melvin Shapp; N. Rhys Merrett; Gary C. Honeycutt

[57] ABSTRACT

In an insulated gate field effect transistors having two gate electrodes, the drain-source current can be controlled by voltages applied at the two gate electrodes. Changes in the input voltage at one gate electrode are accompanied by a change in the input capacitance at the other gate electrode causing a change in load impedance for the source controlling this gate electrode which can give rise to undesirable reactions on the source. A source resistance in the form of a voltage divider has a tap which is connected to the second gate electrode. By proper dimensioning of the voltage divider, the gate-source voltage at the first gate electrode can be made to change, in the event of a change in the input voltage applied to the second gate electrode, by an amount sufficient to counteract any undesirable change in the input capacitance at the first gate electrode.

6 Claims, 4 Drawing Figures

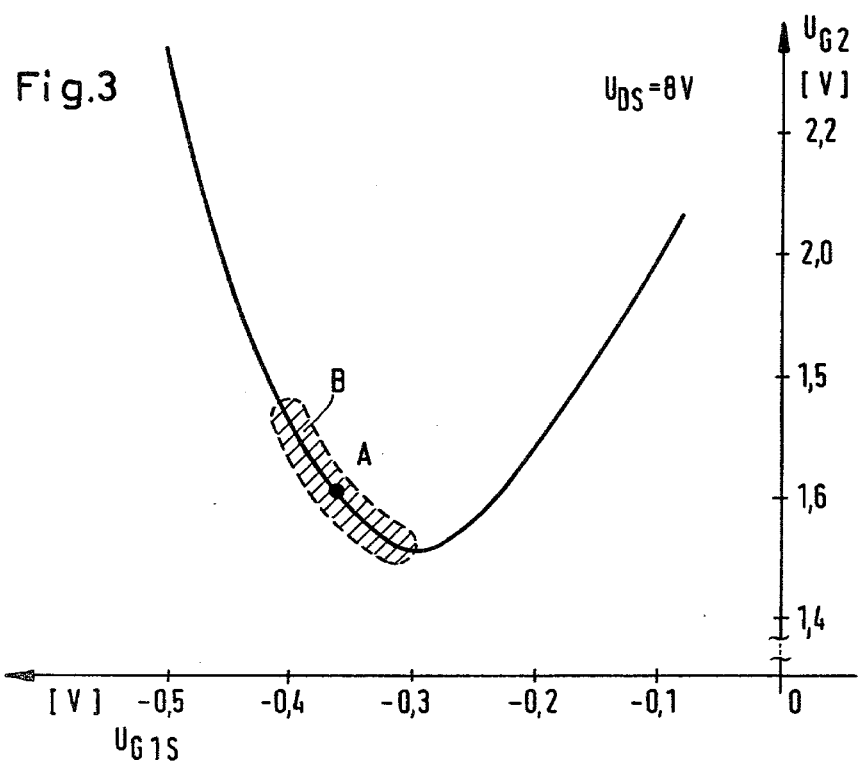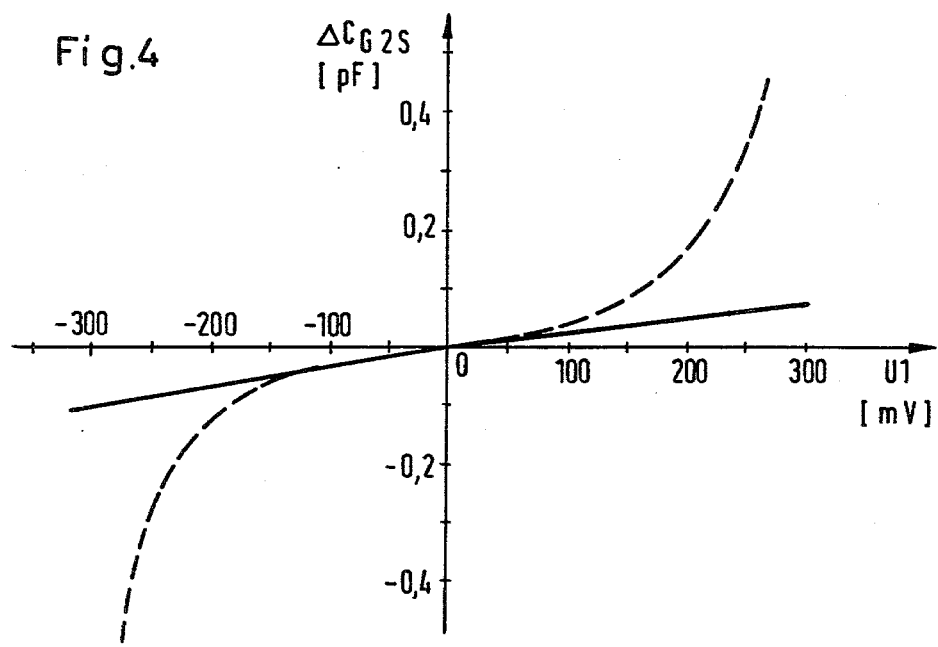

CIRCUIT ARRANGEMENT FOR COMPENSATING THE CHANGE IN INPUT CAPACITANCE AT A FIRST GATE ELECTRODE OF A DUAL-GATE MOS FIELD-EFFECT TRANSISTOR

This invention relates to a circuit arrangement for compensating the change in input capacitance at a first gate electrode of a dual-gate insulated gate field-effect transistor, at whose second gate electrode a variable input voltage is present and of which the source electrode is connected to a source resistance.

In insulated gate field-effect transistors having two gate electrodes, so-called dual-gate insulated gate field-effect transistors, the drain-source current of the field-effect transistor can be controlled through the two gate electrodes. In this connection, it has been found that any change in the input voltage at one gate electrode is accompanied by a change in the input capacitance at the other gate electrode. Accordingly, there is a change in the load impedance for the source controlling this gate electrode which can give rise to undesirable reactions on the source.

Accordingly, the problem which the present invention seeks to solve is to construct a circuit arrangement of the type described above in such a way that the undesirable changes in the input capacitance at one gate electrode which accompany variations in the input voltage at the other gate electrode are greatly reduced.

According to the invention, this problem is solved by a source resistance in the form of a voltage divider of which the tap is connected to the second gate electrode. When the input voltage delivered to this circuit arrangement is changed, the current flowing through the source resistance in the form of a voltage divider also changes. The result of this is a change in the bias voltages which are present between the gate electrodes and the source electrode. Since the entire voltage drop across the source resistance is active for the first gate electrode, whereas it is only the voltage appearing at the tap of the voltage divider which acts as bias for the second gate electrode, the gate-source voltages undergo different changes. By correspondingly dimensioning the voltage divider, the gate-source voltage at the first gate electrode can be made to change, in the event of a change in the input voltage, to just the extent required to counteract the undesirable change in the input capacitance. Accordingly, there are no adverse reactions on a source connectible to the first gate electrode.

The invention is described by way of example in the following with reference to the accompanying drawings, wherein:

FIGS. 2, 3 and 4 are diagrams illustrating the mode of operation of the circuit arrangement shown in FIG. 1.

Figure 1:
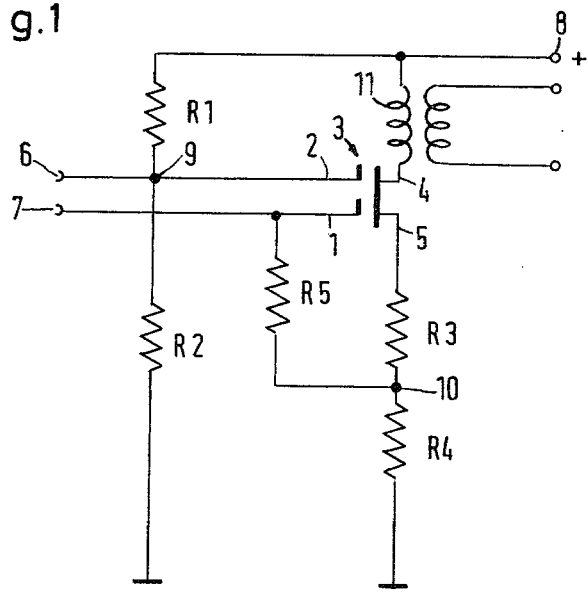
FIG. 1 is a circuit diagram of the circuit arrangement according to the invention.

The circuit arrangement shown in FIG. 1 contains a dual-gate MOS-field-effect transistor 3 comprising two gate electrodes 1 and 2, a drain electrode 4 and a source electrode 5. The gate electrode 2 is connected to the input 6 whilst the gate electrode 1 is connected to the input 7. A voltage divider of the resistors R1 and R2, which is connected between the positive terminal 8 of the feed voltage source and ground is connected by its tap 9 to the gate electrode 2.

One end of a voltage divider of the resistors R3 and R4 is connected to the source electrode 5 of the field-effect transistor 3. At its other end, the voltage divider is connected to ground. The tap 10 of this voltage divider is connected through the resistor R5 to the gate electrode 1 of the field-effect transistor 3.

The output signal of the circuit arrangement can be extracted by means of a transformer 11 of which the primary winding is connected between the drain electrode 4 and the positive terminal 8 of the feed voltage source.

Figure 2:
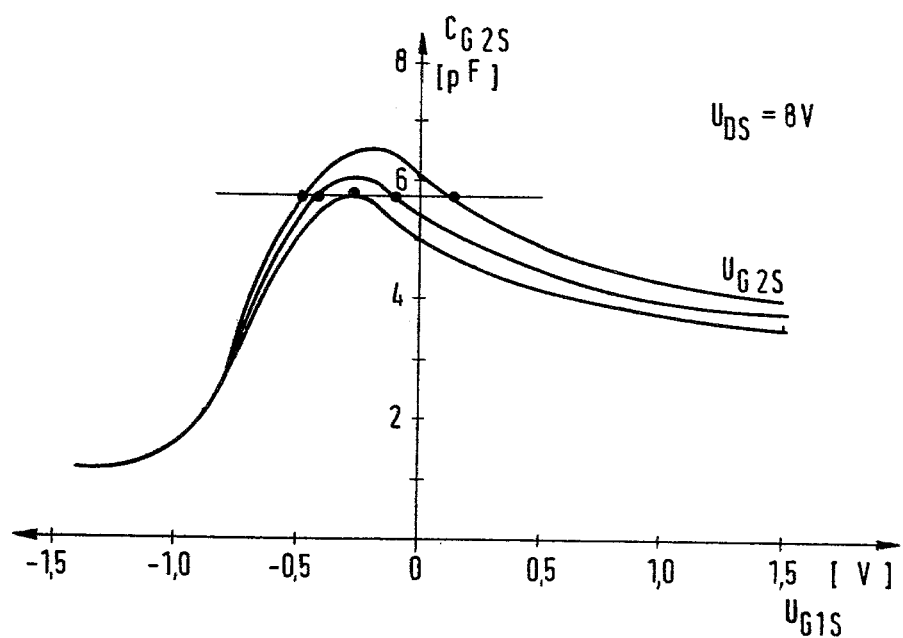

If, in a dual-gate field-effect transistor, of which the source electrode is connected through a resistor to a terminal of the feed voltage source, the input voltage at the gate electrode 1 is changed, the input capacitance $C_{G2S}$ present at the gate electrode 2 also changes. The graph of FIG. 2 illustrates the dependence of this input capacitance upon the voltage between the gate electrode 1 and the source electrode, i.e. upon upon the voltage $U_{G1S}$. By changing the bias voltage of the gate electrode 2, it is possible to record the set of curves for the trend followed by the input capacitance with the voltage $U_{G2S}$ as parameter. The ideal case which means that, in the event of a change in the voltage $U_{G1S}$, there is no change in the capacitance $C_{G2S}$, can be represented in FIG. 2 by a straight horizontal line $C_{G2S}$=const. In FIG. 2, this straight line is drawn for example through the capacitance value 5.7 pF.

The locus for $\Delta C_{G2S}=0$ can be derived from the set of curves in FIG. 2. This locus is shown in FIG. 3. This graph shows how, in the event of a change in the voltage $U_{G1S}$, the voltage $U_{G2S}$ has to change in order to ensure that the working point represented by point A always remains on the locus $\Delta C_{G2S}=0$.

By means of the circuit shown in FIG. 1, the voltage $U_{G2S}$ can be made to change, in the event of a change in the voltage $U_{G1S}$, to just the extent required to keep the working point A in the indicated region B very close to the locus for $\Delta C_{G2S}=0$. By means of the voltage divider of the resistors R3 and R4, it is possible to predetermine the ratio in which the two gate-source voltages change. In this connection, the voltage drop across the resistor R4 acts as bias for the gate electrode 1, whilst the entire voltage drop across the resistors R3 and R4 acts as bias for the gate electrode 2. In one practical circuit, a type BF 900 transistor was used as the dual-gate MOS field-effect transistor. The following values were used for the resistors R1 to R5: R1=100 k ohms, R2=27 k ohms, R3=180 ohms, R4=47 ohms and R5=82 k ohms. The change in capacitance $\Delta C_{G2S}$ in dependence upon the input voltage at the gate electrode 1, as recorded in the graph of FIG. 4, was measured with this circuit. The solid-line curve represents the change in capacitance which occurs in the circuit constructed in accordance with FIG. 1, from which it can be seen that the change in capacitance in the event of heavy modulation of the input voltage is greatly reduced. By contrast, the chain line represents the trend followed by the change in capacitance when an undivided source resistance is used.

One example of the use of the circuit shown in FIG. 1 is its use as a multiplicative mixing stage. In this application, the output signal of a heterodyning oscillator is applied to the gate electrode 2, whilst the signal to be mixed with the heterodyne frequency is applied to the gate electrode 1. In the absence of the described compensation circuit, the change in input capacitance at the gate electrode 2 occurring as a result of changes in the input voltage at the gate electrode 1 would result in detuning of the oscillator. Accordingly, the oscillator frequency would fluctuate at the rhythm of the input signal at the gate electrode 1, so that an undesirable frequency modulation would occur in the output signal of the mixing stage. By contrast, where the mixing stage shown in FIG. 1 is used in a receiver for frequency-modulated signals, the influence of strong amplitude-modulated spurious signals at the receiver input upon the output frequency of the heterodyning oscillator is greatly reduced, so that the troublesome frequency modulation of the mixing stage is also reduced. In general, the described circuit arrangement may be used anywhere where it is desired to avoid troublesome reaction on the signal source connected to the gate electrode 2.

What is claimed is:

1. A circuit arrangement comprising a dual gate insulated gate field effect transistor, first signal source means for applying an input voltage subject to voltage variations to one gate of said transistor; second signal source means for applying a signal to the other gate of said transistor; means for applying a fixed d.c. bias voltage to the other gate of said transistor; and means for d.c. biasing said one gate to compensate for changes in input capacitance at said other gate caused by said voltage variations at said one gate thereby to maintain a substantially constant load impedance for said second signal source means, said biasing means comprising a voltage divider linear resistance means connected to the source of said transistor and having a tap connected to said one gate.

2. A circuit arrangement according to claim 1 wherein said voltage divider resistance means comprises first and second linear resistor means connected in series to the source of said transistor, said first resistor means having a greater resistance than said second resistor means; and wherein a third linear resistor means connects the juncture between said first and second resistor means to said one gate.

3. A circuit arrangement according to claim 2, wherein said third resistor means has a resistance at least an order of magnitude greater than the combined resistances of said first and second resistor means.

4. A multiplicative mixer circuit arrangement comprising a dual gate insulated gate field effect transistor, signal input voltage source means connected to one gate of said transistor; heterodyne oscillator means having an output connected to the other gate of said transistor; mixer output signal derivation means coupled to the drain of said transistor; means for applying a fixed d.c. bias voltage to the other gate of said transistor; and means for d.c. biasing said one gate to compensate for changes in input capacitance at said other gate caused by voltage variations at said one gate of said transistor thereby to maintain a substantially constant load impedance for said heterodyne oscillator means to reduce undesired variations in output frequency thereof, said d.c. biasing means comprising linear resistance voltage divider means connected to the source electrode of said transistor, said voltage divider means having a tap connected by a linear resistor to said one gate electrode.

5. A multiplicative mixer circuit arrangement comprising a dual gate insulated field effect transistor, signal input source means connected to one gate of said transistor; heterodyne oscillator means having an output connected to the other gate of said transistor; mixer circuit output signal derivation means coupled to the drain of said transistor; means for applying a fixed d.c. bias voltage to the other gate of said transistor; and means for biasing said one gate to compensate for changes in input capacitance at said other gate caused by amplitude modulation of signals at said one gate of said transistor thereby to maintain a substantially constant load impedance for said heterodyne oscillator means for reducing frequency modulated distortion of the output signal from said mixer circuit, said biasing means comprising first linear resistor means connected to the source electrode of said transistor and second linear resistor means connecting said first resistor means to a reference potential, said first resistor means having a greater resistance than that of said second resistor; and third linear resistance means having a resistance at least an order of magnitude greater than the combined resistances of said first and second resistor means, said third resistor means connecting the junction between said first and second resistor means to said one gate electrode.

6. A mixer circuit according to claim 5, wherein said fixed d.c. bias means comprises a further voltage divider resistance means having a tap connected to said other gate electrode for defining the bias voltage at said other gate electrode.

* * * * *